United States Patent [19]
Nakamura

[11] Patent Number: 5,550,634
[45] Date of Patent: Aug. 27, 1996

[54] SEMICONDUCTOR MANUFACTURING SYSTEM WITH SELF-DIAGNOSING FUNCTION AND SELF-DIAGNOSING METHOD THEREOF

[75] Inventor: Masaharu Nakamura, Mitaka, Japan

[73] Assignee: Tokyo Seimitsu Co., Ltd.

[21] Appl. No.: 231,760

[22] Filed: Apr. 25, 1994

[30] Foreign Application Priority Data

Apr. 30, 1993 [JP] Japan .................. 5-104233

[51] Int. Cl.$^6$ .................................. G01B 11/00
[52] U.S. Cl. .............. 356/401; 356/375; 250/559.29
[58] Field of Search ........................ 356/373, 375, 356/399, 401; 250/561, 559.29

[56] References Cited

FOREIGN PATENT DOCUMENTS

| | | |
|---|---|---|
| 037663 | 10/1981 | European Pat. Off. . |
| 445871 | 9/1991 | European Pat. Off. . |
| 63-080529 | 4/1988 | Japan . |
| 4-158540 | 6/1992 | Japan . |
| 5-029410 | 2/1993 | Japan . |

*Primary Examiner*—F. L. Evans
*Attorney, Agent, or Firm*—Oliff & Berridge

[57] ABSTRACT

A fine alignment section positions a reference wafer for inspecting the accuracy, delivers a cutting table by an interval value between the regular patterns, and a regular pattern position on the reference wafer for inspecting the accuracy is inspected at that time. An inspecting means compares the detected value by the fine alignment section with a true pattern position on the wafer to inspect the positioning accuracy of a semiconductor manufacturing system. Furthermore, the fine alignment section positions the reference wafer for inspecting the accuracy, delivers the cutting table by an interval between irregular pattern, and detects a irregular pattern position of the reference wafer for inspecting the accuracy at that time. The inspecting means compares the detected value detected by the fine alignment section with the true pattern position on the wafer to inspect the mechanical accuracy of the semiconductor manufacturing system.

21 Claims, 5 Drawing Sheets

SEMICONDUCTOR MANUFACTURING SYSTEM WITH SELF-DIAGNOSING FUNCTION AND SELF-DIAGNOSING METHOD THEREOF

BACKGROUND OF THE INVENTION

1. Field of the Invention

The present invention relates to a semiconductor manufacturing system with a self-diagnosing function and a self-diagnosing method thereof, and more particularly to a semiconductor manufacturing system with a self-diagnosing function and a self-diagnosing method thereof, for inspecting the positioning accuracy, mechanical accuracy, rotational accuracy and the like of a semiconductor manufacturing system such as a dicing machine.

2. Description of the Related Art

There are many semiconductor manufacturing systems which have a moving mechanism for three axes including X, Y and Z axes and rotary mechanism, etc. turning about these axes. For example, when a wafer is aligned by a dicing machine, a wafer table mounted thereon with wafer is moved in directions of X and Y axes and the wafer table is rotated about its center, so that the wafer can be aligned.

In recent years, miniaturization of a semiconductor chips is planned, and there is required a semiconductor manufacturing system of high accuracy for manufacturing thus miniaturized semiconductor chip. However, even the semiconductor manufacturing system, which has been originally manufactured with high accuracy, deteriorates in the accuracy thereof due to the mechanical wear, slight loosing of screws and and the like as the working time is lengthened. Accordingly, it is necessary that the semiconductor manufacturing system is inspected in each predetermined working time, and, for inspecting the accuracy, a reference wafer for inspecting the accuracy is used for example. On the surface of the reference wafer for inspecting the accuracy, there are formed patterns for inspecting at regular intervals. When this reference wafer for inspecting the accuracy is used in a dicing machine for example, the reference wafer for inspecting the accuracy is moved in directions of X and Y axes to detect the regular patterns, and the thus detected value is compared with an interval between patterns for inspecting the accuracy to thereby inspect the accuracy of the dicing machine.

In the standard wafer for inspecting the accuracy, the patterns for inspecting are formed at regular intervals. Hence, the accuracy of the dicing machine at the time of moving by a predetermined interval can be inspected, however, the accuracy of the dicing machine at the time of moving by a random interval can not be inspected. However, when a wafer is worked on by the dicing machine actually, the dicing machine is moved by a random interval. Accordingly, even if the accuracy of the dicing machine is inspected at the time of moving by a predetermined interval by the conventional reference wafer for inspecting the accuracy, it does not mean that the working accuracy of the dicing machine actually operated is inspected.

That is, with the conventional reference wafer for inspecting the accuracy, the accuracy of the dicing machine deteriorates due to wear of mechanical parts, slight loosing of screws and the like cannot be inspected. Accordingly, until such a state is brought about that the accuracy of the dicing machine is greatly deteriorated the products to be worked on do not satisfy the regulated accuracy, an operator does not notice the deterioration of the accuracy of the dicing machine. However, even when the operator does not notice the deterioration of the accuracy of the dicing machine by the conventional inspection, actually the accuracy of the dicing machine has deteriorated. Hence, the products worked on by the dicing machine during this time do not meet the quality standards. Furthermore, if the maintenance is postponed until the accuracy has become greatly deteriorated, the wear of the mechanical parts, loosening of screws and the like are increased. Hence, a large amount of expense is required for restoration of the accuracy of the dicing machine, and such a problem increases the amount of time required for maintenance.

SUMMARY OF THE INVENTION

The present invention has been developed to eliminate the above-described disadvantage and has at its aim the provision of a semiconductor manufacturing system with a self-diagnosing function and a self-diagnosing method thereof, which capable of inspecting the deteriorated accuracy of a semiconductor manufacturing system such as a dicing machine by a self-diagnosis, restoring the small deterioration in the accuracy caused by the semiconductor manufacturing system and thus stabilizing the quality of the products worked on by the semiconductor manufacturing system for the long period time.

To achieve the above-described aim, according to the present invention, a semiconductor manufacturing system with a self-diagnosing function, having a moving mechanism means capable of moving in any one axial direction out of X, Y and Z axes, is characterized and is comprising: a reference wafer for inspecting the accuracy, in which patterns for inspecting the positioning accuracy, which are arranged at regular intervals, are formed, and patterns for inspecting the mechanical accuracy, being in parallel to the pattern for inspecting the positioning accuracy and arranged at irregular intervals; a housing section for housing the reference wafer for inspecting the accuracy; a conveying means capable of conveying the reference wafer for inspecting the accuracy, which has been taken out of the housing section to an alignment position of the reference wafer for inspecting the accuracy, and housing it into the housing section from the alignment position; an alignment means for coinciding the direction of the patterns of the reference wafer for inspecting the accuracy, which has been conveyed to the alignment position, with a moving axial direction of the moving mechanism means, detecting a position of the patterns for inspecting the positioning accuracy when the moving mechanism means is delivered by an interval between the regular patterns, and detecting a position of patterns for inspecting the mechanical accuracy when the moving mechanism means is delivered by an interval between the irregular patterns; and an inspecting means for inspecting the positioning accuracy of the moving mechanism means on the basis of the detected value of the position of the patterns for inspecting the positioning accuracy, which has been detected by the alignment means and the interval between the regular patterns, and inspecting the mechanical accuracy of the moving mechanism means on the basis of the detected value of the position of the patterns for inspecting the mechanical accuracy, which has been detected by the alignment means and the interval between the irregular patterns.

According to the present invention, the patterns for inspecting the positioning accuracy are arranged at regular intervals in the reference wafer for inspecting the accuracy, and the patterns for inspecting the mechanical accuracy are arranged in parallel to the patterns for inspecting the positioning accuracy and at irregular intervals. This reference wafer for inspecting the accuracy is housed in the housing section, and the reference wafer for inspecting the accuracy, which has been housed into the housing section, is taken out of the housing section by the conveying means. The conveying means conveys the reference wafer for inspecting the accuracy, which has been taken out of the housing section, to the alignment position, conveys it from the alignment position to the housing section and houses it back to the housing section again.

Furthermore, the alignment means coincides in the direction of the patterns for inspecting the positioning accuracy of the reference wafer for inspecting the accuracy, which has been conveyed to the alignment position, with the moving axial direction of the moving mechanism means provided on the semiconductor manufacturing system. Further, the alignment means detects the position of the patterns for inspecting accuracy when the moving mechanism means is delivered by the interval between the regular patterns, and detects the position of the patterns for inspecting the mechanical accuracy when the moving mechanism means is delivered by the interval between the irregular patterns. The inspecting means detects the positioning accuracy of the moving mechanism means on the basis of the detected value, which has been detected by the alignment means, and the regular interval of the patterns for inspecting the positioning accuracy, and detects the mechanical accuracy of the moving mechanism means on the basis of the detected value, which has been detected by the alignment means, and the irregular interval of the patterns for inspecting the mechanical accuracy.

BRIEF DESCRIPTION OF THE DRAWINGS

The exact nature of this invention, as well as other aims and advantages thereof, will be readily apparent from consideration of the following specification relating to the accompanying drawings, in which like reference characters designate the same or similar parts throughout the figures thereof and wherein.

DESCRIPTION OF THE PREFERRED EMBODIMENT

A detailed description will hereafter be given of the preferred embodiment of a semiconductor manufacturing system with a self-diagnosing function according to the present invention with reference to the accompanying drawings.

Figure 1:
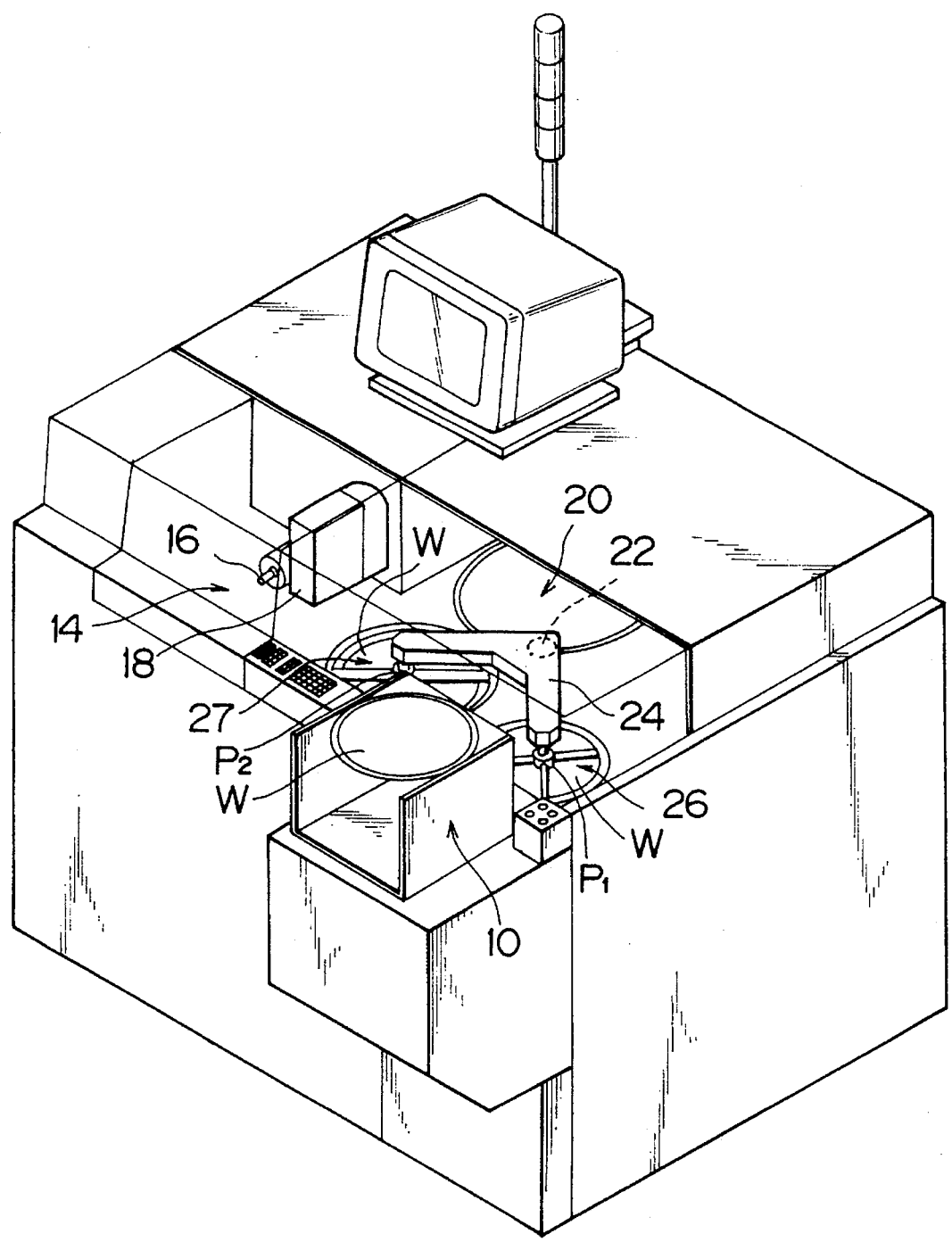
FIG. 1 is an oblique view showing the semiconductor manufacturing system with a self-diagnosing function according to the present invention.
Figure 2:
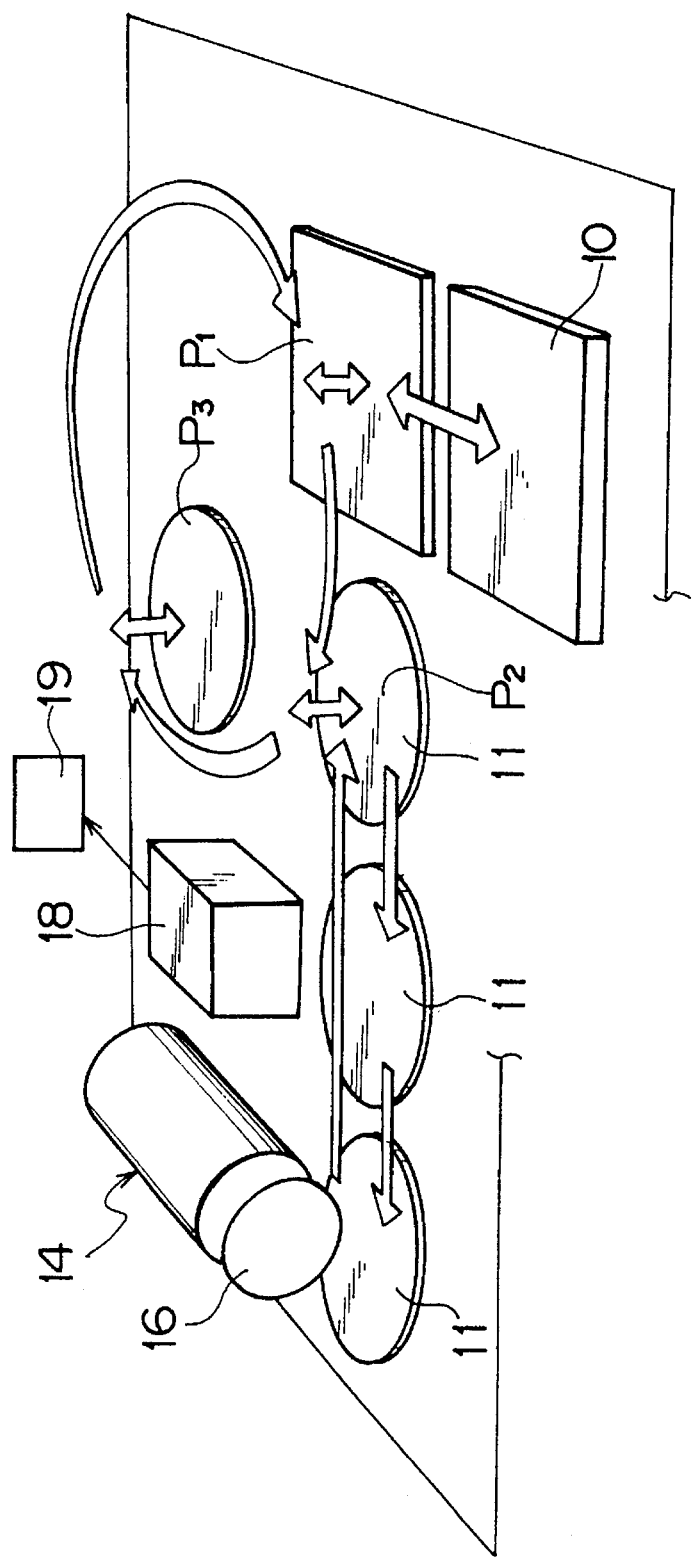
FIG. 2 is an explanatory view explaining the operation of the semiconductor manufacturing system with a self-diagnosing function according to the present invention.

FIG. 1 is an oblique view showing a semiconductor manufacturing system with a self-diagnosing function according to the present invention. FIG. 2 is an explanatory view of the operation thereof. As it shows in the drawings, the semiconductor manufacturing system with a self-diagnosing function (hereinafter explained as a dicing machine) is supplied with a wafer W from a cassette 10, and includes a prealignment position P1 for prealigning the wafer W, a load-unload position P2 for loading the wafer W to and unloading the wafer W from a cutting table 11, a washing position P3 for washing the cut wafer W, and an unload position, not shown, for unloading a washed wafer W.

Furthermore, the dicing machine moves the wafer W, which has been loaded onto the cutting table 11 (refer to FIG. 2) at the load-unload position P2, together with the cutting table 11 and fine alignment of the wafer W at a fine alignment section 18. That is, the fine alignment section 18 includes a picture image take-in section, where a taken-in picture image is processed by pattern matching and the wafer W is fine-aligned. An inspecting means 19 to be described hereunder is connected to the fine alignment section 18.

Thereafter, a fine-aligned wafer W is cut into a required number of semiconductor chips by a diamond cutter 16 of a cutting section 14. Thus, the cut wafer W is conveyed to a cutting section 20, where the cut wafer W is washed. Thereafter, the wafer W washed in the washing section 20 is conveyed to the unload position and housed into a cassette 10 therefrom.

The above-described prealignment position P1, load-unload position P2, washing position P3 and unload position are arranged in a relationship, in which the aforesaid positions are positioned at vertices of a square, and the conveyance of the wafer W in theses positions is performed by an arm section 24, which has a rotary shaft 22 at the center of the aforesaid square and is extended in a V shape toward two adjoining positions from the rotary shaft 22. Incidentally, designated at 26 and 27 in FIG. 1 are chuck portions for mounting and releasing the wafer W.

Figure 3:
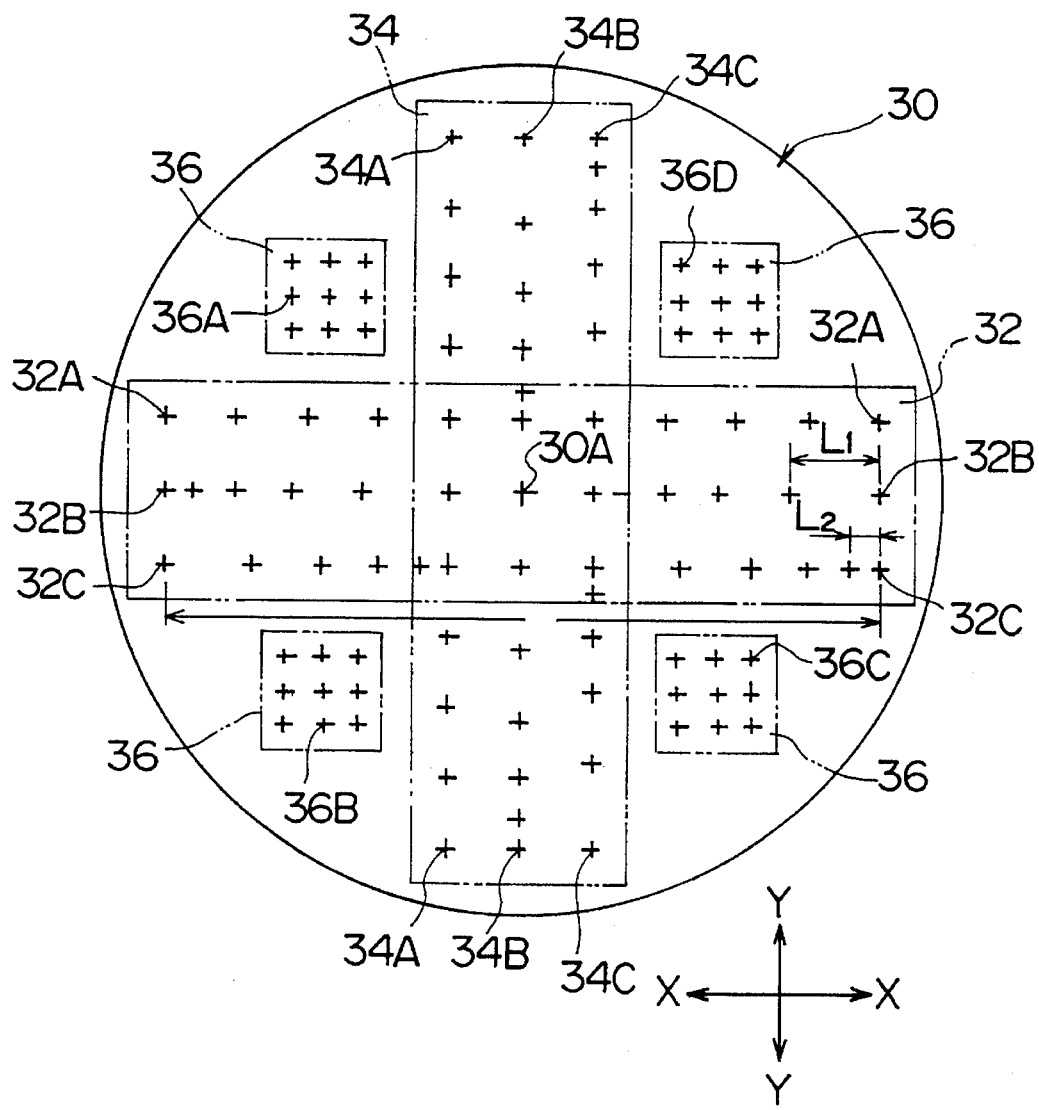
FIG. 3 is a plan view showing the reference wafer for inspecting the accuracy used in the semiconductor manufacturing system with a self-diagnosing function according to the present invention.

FIG. 3 is a plan view showing the reference wafer for inspecting the accuracy used in the dicing machine according to the present invention. As shown in FIG. 3, a reference wafer 30 for inspecting the accuracy is formed to provide a disc shape similarly to an ordinary wafer to be worked on, and groups of patterns 32, 34 and 36 for positioning are formed on the surface thereof. The group of patterns 32 is used for inspecting the moving accuracy in a direction of X axis, and the group of patterns 34 is used for inspecting the moving accuracy in a direction of Y axis. The group of patterns 32 includes regular patterns 32A, 32A . . . , first irregular patterns 32B, 32B . . . and second irregular patterns 32C, 32C . . .

The regular patterns 32A, 32A . . . are arranged at regular intervals. The 1st irregular patterns 32B, 32B . . . are arranged at random intervals based on a table of random numbers (for example, the ratios between the intervals are 1, 3, 5, 7, 11 and 13). Furthermore, the 2nd irregular patterns 32C, 32C . . . are formed in order to be in a direction opposite (symmetrical) to the 1st irregular patterns 32B, 32B . . . .

By forming the 1st irregular patterns 32B, 32B . . . and the 2nd irregular patterns 32C, 32C . . . to be symmetrical to each other, as described above, for example, comparatively larger intervals (L1) between the 1st irregular patterns 32B, 32B . . . are compensated by comparatively smaller intervals (L2) between the 2nd irregular patterns, so that the mechanical accuracy over the whole range(L), where the patterns are formed, can be inspected.

Furthermore, the group of patterns 34 are formed in a state where the group of patterns 32 can be rotated 90°. That is, the regular patterns 34A, 34A . . . are arranged at regular intervals, and the 1st irregular patterns 34B, 34B . . . are arranged at random intervals based on the table of random numbers. Further, the 2nd irregular patterns 34C, 34C . . . are arranged to be in a direction opposite to the 1st irregular patterns 34B, 34B . . . By forming the group of patterns 32 in the direction of X axis and the group of patterns 34 in the direction of Y axis as described above, the positioning accuracy and mechanical accuracy in the directions of X axis and Y axis can be inspected. Further, by forming the groups of patterns 32 and 34 in the directions of X axis and Y axis to perpendicularly intersect each other, so that the straightness of the moving mechanism provided on the dicing machine in the directions of X axis and Y axis can be inspected.

The group of patterns 36 is formed equiangularly (i.e., intervals of 90°) at four positions on one and the same circular arcuation of the reference wafer 30 for inspecting the accuracy, and, in the group of patterns 36, there are formed 1st patterns 36A, 36A . . . for inspecting the rotational accuracy, 2nd patterns 36B, 36B . . . for inspecting the rotational accuracy, 3rd patterns 36C, 36C . . . for inspecting the rotational accuracy and 4th patterns 36D, 36D . . . for inspecting the rotational accuracy. Then, when the reference wafer 30 for inspecting the accuracy is rotated about the center 30A through 90°, the 1st pattern 36A for inspecting the rotational accuracy is positioned at the same position as the 2nd pattern 36B for inspecting the rotational accuracy, the 2nd pattern 36B for inspecting the rotational accuracy is positioned at the same position as the 3rd pattern 36C for inspecting the rotational accuracy, the 3rd pattern 36C for inspecting the rotational accuracy is positioned at the same position as the 4th pattern 36D for inspecting the rotational accuracy, and the 4th pattern 36D for inspecting the rotational accuracy is positioned at the same position as the 1st pattern 36A for inspecting the rotational accuracy. By forming the group of patterns 36 for inspecting the rotational accuracy as described above, the rotational accuracy of the dicing machine can be inspected.

Incidentally, the shapes of patterns used in the groups of patterns 32, 34 and 36 are cross shapes as shown in FIG. 3. It is generally known that the pattern matching using this crossshaped pattern has the high accuracy of positional detection.

Furthermore, pluralities of patterns 40 and 42 for inspecting the vibrations in the directions of X axis and Y axis (refer to FIG. 4) are formed along the groups of patterns 32, 34 and 36 in the reference wafer 30 for inspecting the accuracy.

Figure 4A:
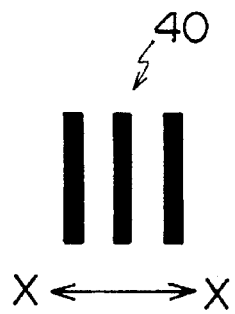
FIG. 4(A) is a plan view explaining the patterns for inspecting the vibrations in the direction of X axis, which are formed in the reference wafer for inspecting the accuracy as shown in FIG. 3.
Figure 4B:
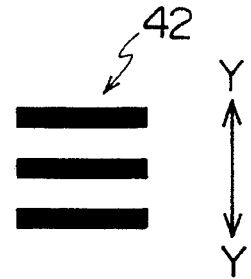
FIG. 4(B) is a plan view explaining the patterns for inspecting the vibrations in the direction of Y axis, which are formed in the reference wafer for inspecting the accuracy as shown in FIG. 3.

The pattern 40 for inspecting the vibrations in the direction of X axis and the pattern 42 for inspecting the vibrations in the direction of Y axis as shown in FIG. 4 have high reliability when the picture image shake is detected during a picture image take-in time (e.g., 1/30 sec) at the time of pattern matching. By adding the pattern 42 for inspecting the vibrations in the direction of Y axis to the pattern 40 for inspecting the vibrations in the direction of X axis as described above, the vibrations in the directions of x axis and Y axis can be inspected. Further, by forming either one of the patterns 40 and 42 for inspecting the vibrations along the group of patterns 36, the vibrations at the time of a rotation through 90° can be inspected.

Figure 5:
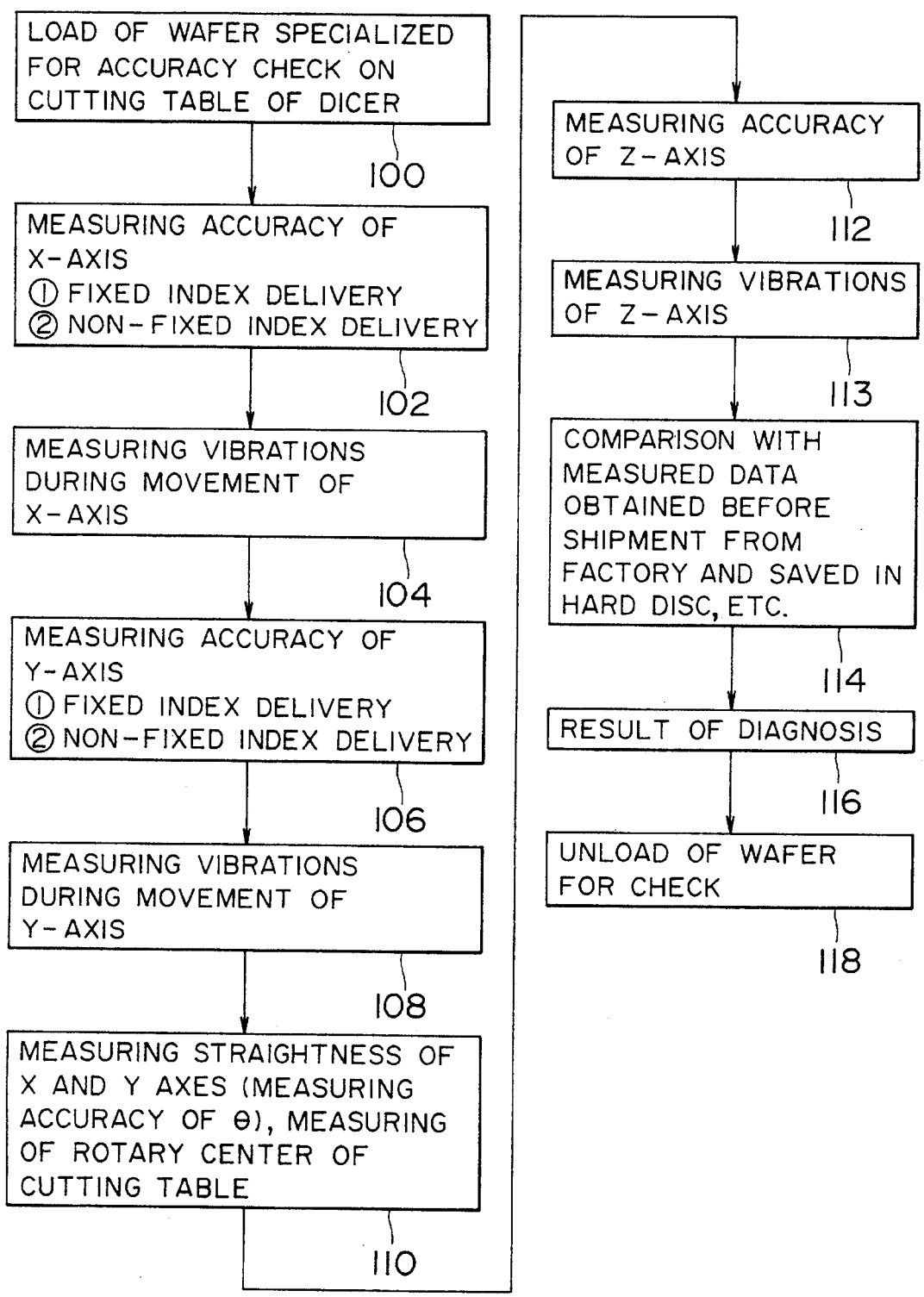
FIG. 5 is a flow chart explaining the operation of the semiconductor manufacturing system with a self-diagnosing function according to the present invention.

The action of the dicing machine with the above-described arrangement will be explained with reference to the explanatory view of the operation as shown in FIG. 2 and the flow chart as shown in FIG. 5.

First, the reference wafer 30 for inspecting the accuracy is housed in the cassette 10, and the cassette 10 is mounted on an elevator section of the dicing machine. Next, the dicing machine is operated to take out the reference wafer 30 for inspecting the accuracy from the cassette 10, and thus the reference wafer 30, which is taken out, for inspecting the accuracy is conveyed to the prealignment position P1. Subsequential, the reference wafer 30 for inspecting the accuracy, which has been conveyed to the prealignment position P1, is conveyed to the cutting table 11 of the cutting section 14 shown in FIG. 1 by the arm section 24 (Step 100).

Upon completion of the process of Step 100, the positioning accuracy and mechanical accuracy in the direction of X axis are inspected (Step 102). That is, the cutting table 11 is moved in the directions of X axis and Y axis, whereby the reference wafer 30 for inspecting the accuracy mounted on the cutting table is positioned at a position, where the regular pattern 32A of the group of patterns 32 can be detected, in the fine alignment section 18. Next, the reference wafer 30 for inspecting the accuracy of the dicing machine is moved together with the cutting table in the direction of X axis by the same interval as the regular patterns 32A, 32A . . . , whereby the position of the regular pattern 32A is detected in the fine alignment section 18. This process is performed on a plurality of the regular patterns 32A. Then, said inspecting means 19 inspects the positioning accuracy in the direction of X axis on the basis of the detected positioning accuracy. Furthermore, the detected positioning accuracy of the patterns 32A is used as the data for cumulative corrections during the working of the wafers.

Subsequently, the reference wafer 30 for inspecting the accuracy is positioned at a position, where the 1st irregular pattern 32B can be inspected, in the fine alignment section 18. Next, the reference wafer 30 for inspecting. the accuracy is moved together with the cutting table 11 in the direction of X axis by the same interval as the 1st irregular patterns 32B, 32B . . . , whereby the position of the 1st irregular pattern 32B is detected in the fine alignment section 18. This process is performed on a plurality of the 1st irregular patterns 32B. Subsequently, the reference wafer 30 for inspecting the accuracy is positioned at a position, where the 2nd irregular pattern 32C can be detected, in the fine alignment position 18. Next, the reference wafer 32 for inspecting the accuracy is moved together with the cutting table 11 in the direction of X axis by the same interval as the 2nd irregular patterns 32C, 32C . . . , whereby the position of the 2nd irregular pattern 32C is detected in the fine alignment section 18. This process is performed on a plurality of the irregular patterns 32C. Then, the inspecting means inspects the mechanical accuracy in the direction of X axis on the basis of the detected positioning accuracy of the plurality of patterns 32B and 32C. With this arrangement, a process of Step 102 is completed.

Subsequently, the cutting table 11 is moved, whereby the reference wafer 30 for inspecting the accuracy is positioned at a position, where the pattern 40 for inspecting the vibrations can be detected, in the fine alignment section 18. Next, the reference wafer 30 for inspecting the accuracy is moved together with the cutting table 11 in the direction of X axis by a predetermined interval, and stopped. In this case, when the mechanical vibrations take place in the direction of X axis at the time of stopping, the pattern 40 for inspecting the vibrations is shaken, whereby the pattern 40 for inspecting the vibrations is measured in the fine alignment section 18, so that the amplitude of the pattern 40 for inspecting the vibrations can be detected. The inspecting means inspects the mechanical vibrations in the direction of X axis on the detected value (Step 104).

Incidentally, since the vibrations due to the movement in Step 104 relies on the delay time after the movement, many times of measurements are performed by use of respective delay times as parameters, to thereby seek the magnitude of the vibrations and statistical variations.

Subsequently, the positioning accuracy and mechanical accuracy in the direction of Y axis are inspected (Step 106). For the inspection of the positioning accuracy and mechanical accuracy in the direction of X axis, the group of patterns 32 has been used. However, here, for the inspection of the positioning accuracy and mechanical accuracy in the direction of Y axis, the group of patterns 34 is used. The procedure of inspecting the accuracy in the direction of Y axis includes the inspection of the positioning accuracy in the direction of X axis by the regular pattern 34A of the group of patterns 34 similarly to the above-described inspection of the accuracy in the direction of Y axis, and the use of the detected positioning accuracy of the pattern 34A as the data for cumulative corrections during working of the wafers. Furthermore, the mechanical accuracy in the direction of Y axis is inspected by the irregular patterns 34B and 34C of the group of patterns 34. With this arrangement, a process of Step 106 is completed.

Subsequently, the cutting table 11 is moved, whereby the reference wafer 30 for inspecting the accuracy is positioned at a position, where the pattern 42 for inspecting the vibrations can be detected, in the fine alignment section 18. Next, the reference wafer 30 for inspecting the accuracy is moved together with the cutting table 11 in the direction of Y axis by a predetermined interval, and stopped. In this case, when the mechanical vibrations take place in the direction of Y axis at the time of stopping, the pattern 42 for inspecting the vibrations is shaken, whereby the amplitude of the pattern 42 for inspecting the vibrations is detected. The inspecting means detects the mechanical vibrations in the direction of Y axis on the basis of the detected value (Step 108).

Incidentally, similarly to Step 104, in Step 108, the vibrations due to the movement relies on the delay time after the movement, whereby many times of measurements are performed by the use of respective delay times as parameters, to thereby seek the magnitude of vibrations and statistical variations.

Upon completion of process of Step 108, the straightness and rotational accuracy in the directions of X axis and Y axis are inspected (Step 110). In Step 110, firstly, the group of patterns 32 in the direction of X axis and group of patterns 34 in the direction of Y axis are used, whereby the straightness is inspected when the cutting table 11 is moved in the directions of X axis and Y axis. Subsequently, the cutting table 11 is moved in the directions of X axis and Y axis, whereby the reference wafer 30 for inspecting the accuracy, which is mounted on the cutting table 11, is positioned at a position, where the 1st pattern 36A of the group of patterns 36 can be detected, in the fine alignment section 18. Next, the cutting table 11 is operated so as to rotate the reference wafer 30 for inspecting the accuracy through 90° in the clockwise direction, whereby the position of the 2nd pattern 36B is detected in the fine alignment section 18. This process is performed on pluralities of patterns 36A and 36B. Then, the inspecting means detects the rotational accuracy of the cutting table 11 when it is rotated through 90° on the basis of the detected positioning accuracy. In this case, the position of the rotary center is detected by use of the pluralities of patterns 36A and 36B, thus the completing a process of Step 110.

Subsequently, the cutting table 11 is moved by the thickness of the reference wafer 30 for inspecting the accuracy from a preset position to the direction of Z axis. Then, when the cutting table 11 is moved by the thickness of the reference wafer 30 for inspecting the accuracy, the definition of the patterns formed on the reference wafer 30 for inspecting the accuracy is detected. The inspecting means inspects the accuracy in the direction of Z axis on the basis of the detected result (Step 112). In this case, the amplitude of the patterns can be inspected at the time when the cutting table 11 ceases to move, so that the vibrations in the direction of Z axis can be inspected (Step 113).

Upon completion of Step 113, the inspected data obtained in the above-described process are compared with the measured data previously stored in a hard disc or the like before the shipment, whereby it is judged whether the respective axes satisfy the values of specification in accuracy (Step 114). Incidentally, the measured data before the shipment are the inspected data obtained by repeating the above-described processes of Steps 110 to 113 in the dicing machine before the shipment and stored in a hard disc or the like. Then, the result which is judged in Step 114 is output as the result of diagnosis, thus completing the self-diagnosis (step 116).

Upon completion of the self-diagnosis, the reference wafer 30 for inspecting the accuracy, which is mounted on the cutting table 11, is conveyed to the second position P2, and the reference wafer 30 for inspecting the accuracy, which has been conveyed to the second position P2, is conveyed to the first position, i.e., the prealignment position P1. Then, the reference wafer 30 for inspecting the accuracy, which has been conveyed to the prealignment position P1, is returned to the cassette 10 therefrom. With this arrangement, unloading of the reference wafer 30 for inspecting the accuracy is completed (Step 118).

In the above embodiment, the description has been given of the case where the reference wafer 30 for inspecting the accuracy is housed in the cassette 10, into which the wafer W to be worked on is to be housed, however, the invention should not necessarily be limited to this, and it is possible to provide a cassette specialized for housing the reference wafer 30 for inspecting the accuracy on the dicing machine. Description will hereunder be given of a second embodiment when the cassette specialized for housing the reference wafer 30 for inspecting the accuracy is provided on the dicing machine with reference to FIG. 6. Incidentally, in FIG. 6, the same reference numerals are used to designate same or similar parts corresponding to ones as shown in FIG. 2, so that the detailed description need not be repeated.

Figure 6:
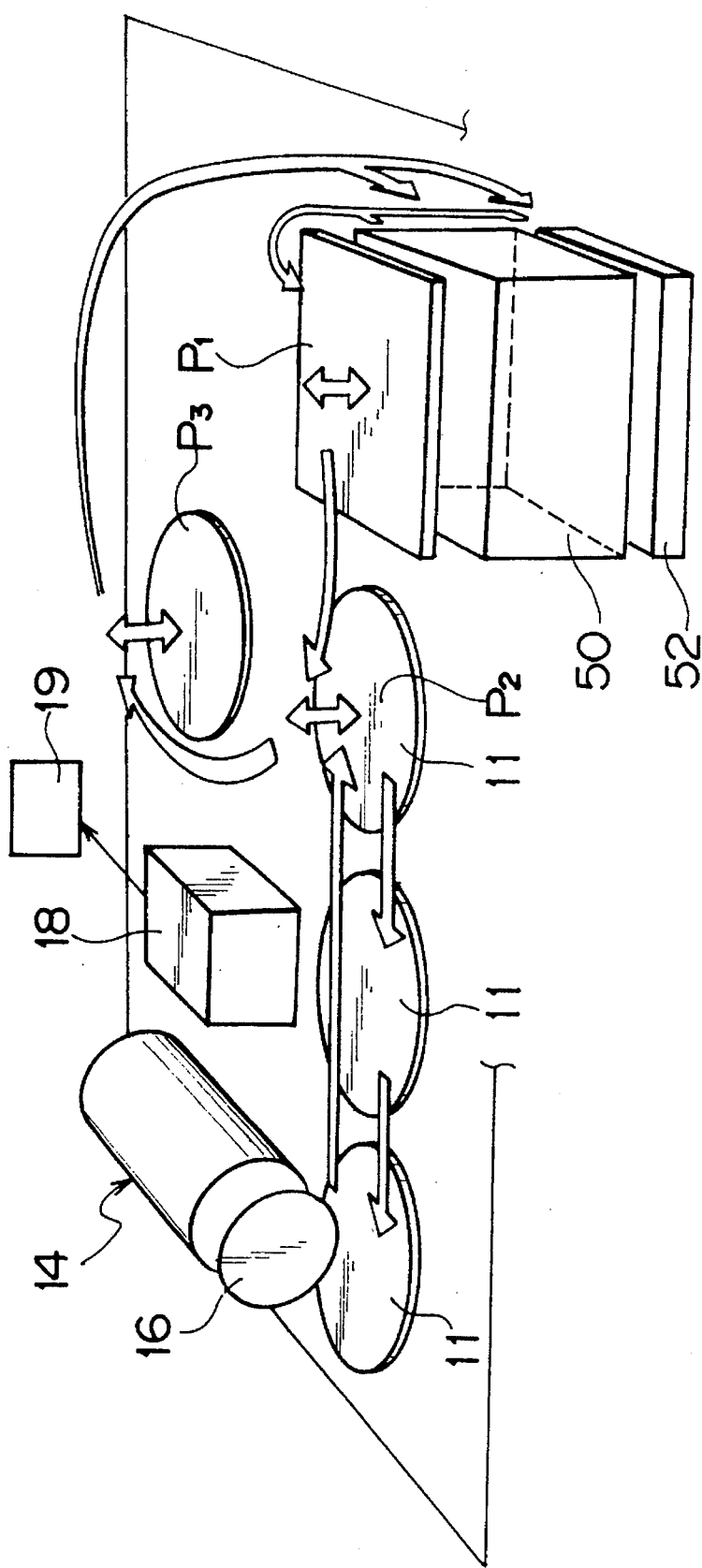
FIG. 6 is an explanatory view explaining the operation of the second embodiment of the semiconductor manufacturing system with a self-diagnosing function according to the present invention.

As shown in FIG. 6, a cassette 50 is provided downward for the prealignment position P1 of the dicing machine. A wafer to be worked on is housed in the cassette 50, and the wafer to be worked on, which has been housed in the cassette 50, is conveyed to the prealignment position P1. Then, the wafer to be worked on, which has been conveyed to the prealignment position, is conveyed to the cutting table 11 in the load-unload position P2 similarly to the first embodiment. The wafer to be worked on, which has been conveyed to the cutting table 11, is worked on in the same procedure as in the first embodiment, and returned to the cassette 50. In this case, the wafer to be worked, which has been worked on, may be returned to the cassette 50 through the prealignment position P1, or returned to cassette 50 not through the prealignment position P1.

Provided downwardly from the cassette 50 is a specialized cassette 52, in which the reference wafer 30 for inspecting the accuracy is housed. The reference wafer 30 for inspecting the accuracy, which has been housed in the specialized cassette 50, is conveyed to the cutting table 11 in the load-unload position P2 through the prealignment position P1 similarly to the wafer to be worked on. The specialized cassette 52, which has been conveyed to the cutting table 11, undergoes the inspecting process by a similar procedure as in the first embodiment, and returned to the specialized cassette 52 after the completion of the self-diagnosis. Then, upon completion of the inspecting process, the reference wafer 30 for inspecting the accuracy may be returned to the specialized cassette 52 through the prealignment position P1, or returned directly to the specialized cassette 52 not through the prealignment position P1.

In the first and second embodiments, description has bee given of the case where the positioning accuracy and mechanical accuracy of three axes including X, Y and Z are inspected, however, the invention should not necessarily be limited to this, and it is possible to inspect the positioning accuracy and mechanical accuracy of one or two axes out of X, Y and Z axes.

Furthermore, in the first and second embodiments, description has been given of the case where the accuracy and the like of the dicing machine are self-diagnosed by the reference wafer 30 for inspecting the accuracy, however, the invention should not necessarily be limited to this, and it is possible to self-diagnose the accuracy and the like of the semiconductor manufacturing system such as a proving machine, a memory repair system and others by use of the reference wafer 30 for inspecting the accuracy.

Further, in the above embodiments, the 1st and 2nd irregular patterns of the reference wafer 30 for inspecting the accuracy are arranged at the irregular intervals on the basis of the table of random numbers, however, the invention should not necessarily be limited to this, and the 1st and 2nd irregular patterns may be arranged at irregular intervals by the method other than the table of random numbers.

Furthermore, in the above embodiments, the group of patterns 36 for inspecting the rotational accuracy of the reference wafer 30 for inspecting the accuracy is formed at four positions, however, the invention should not necessarily be limited to this, and may be formed at least at two positions.

As has been described above, according to the semiconductor manufacturing system with a self-diagnosing function and the method of self-diagnosing function and the method of self-diagnosing as disclosed in the present invention, the alignment means coincides the direction of the patterns of the reference wafer for inspecting the accuracy, which has been conveyed to the alignment position, with the direction of the moving shaft of the moving mechanism means provided on the semiconductor manufacturing system. Further, the alignment means detects the position of the pattern for inspecting the positioning accuracy when the moving mechanism is delivered by the regular interval, and detects the position of the pattern for inspecting the mechanical accuracy when the moving mechanism means is delivered by the above-described irregular interval. The inspecting means detects the positioning accuracy of the moving mechanism means on the basis of the detected value detected by the alignment means and the regular interval of the pattern for inspecting the positioning accuracy, and detects the mechanical accuracy of the moving mechanism means on the basis of the detected value detected by the alignment means and the irregular interval of the pattern for inspecting the mechanical accuracy.

Accordingly, the working accuracy at the time when the wafer to be worked on is actually worked on by the semiconductor manufacturing system and the inspecting accuracy at the time when the wafer to be worked on is inspected by the semiconductor manufacturing system can be inspected. With this arrangement, the small deterioration in accuracy, which is caused in the semiconductor manufacturing system, is detected by the self-diagnosis, whereby the detected deterioration in accuracy can be restored, so that the quality of the products by the semiconductor manufacturing system can be stabilized for a long period of time.

Furthermore, by standardizing the pattern arrangement of the reference wafer for inspecting the accuracy of the semiconductor manufacturing system according to the present invention, the following characteristics features can be obtained.

(1) The efficiency of the inspecting work for the assurance of the accuracy of the semiconductor manufacturing system claimed in the present invention can be improved at the time of shipment from the factory.

(2) The accuracy of the semiconductor manufacturing system with a self-diagnosing function, which is actually used, can be compared with the accuracy at the time of manufacturing.

(3) The semiconductor manufacturing system with a self-diagnosing function can be easily compared in accuracy therebetween.

(4) The accuracy of the semiconductor manufacturing system with a self-diagnosing function can be inspected without requiring the special skill.

(5) When the accuracy of the semiconductor manufacturing system with a self-diagnosing function has deteriorated, the cause of the deterioration can be easily specified.

(6) The self-correction can be performed on the basis of the result of the self-diagnosis of the semiconductor manufacturing system with a self-diagnosing function.

It should be understood, however, that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A semiconductor manufacturing system having a self-diagnosing function, the system comprising:

a reference wafer for inspecting at least positional accuracy and mechanical accuracy of the system, the reference wafer having groups of patterns each including a plurality of patterns;

a housing section for housing said reference wafer;

conveying means for conveying said reference wafer that has been removed from said housing section, to an alignment position for said reference wafer and from said alignment position to said housing section;

a moving means capable of moving said reference wafer at least in one of an X axial direction and a Y axial direction;

alignment means for coinciding an extending direction of said groups of patterns of said reference wafer that has been conveyed to said alignment position with a moving direction of said moving means, and for detecting a position of at least one of said plurality of patterns when said moving means is delivered by an interval between the at least one of said plurality of patterns; and inspecting means for inspecting an accuracy of said moving means at least in the X axial direction and the Y axial direction based on the detected value of said pattern position detected by said alignment means and said pattern interval of said at least one of said plurality of patterns.

2. A semiconductor manufacturing system with a self-diagnosing function as set forth in claim 1, wherein said housing section is a housing section specialized for said reference wafer.

3. A semiconductor manufacturing system with a self-diagnosing function as set forth in claim 1, wherein said housing section is a combined housing section for housing said reference wafer and a wafer to be worked on.

4. A semiconductor manufacturing system with a self-diagnosing function as set forth in claim 1, wherein, in said reference wafer, said groups of patterns are extended in one direction.

5. A semiconductor manufacturing system with a self-diagnosing function as set forth in claim 1, wherein, in said reference wafer, said groups of patterns includes a first group of patterns and a second group of patterns, wherein said first group of patterns for inspecting the mechanical accuracy and said second group of patterns for inspecting the positioning accuracy are both extended in a first direction and in a second direction perpendicularly intersecting said first direction.

6. A semiconductor manufacturing system with a self-diagnosing function as set forth in claim 1, wherein said groups of patterns formed in said reference wafer include a pattern for inspecting vibrations in at least the X axial direction.

7. A semiconductor manufacturing system with a self-diagnosing function asset forth in claim 1, wherein said moving means includes a mechanism for rotating said reference wafer, and said groups of patterns, which are formed in said reference wafer, includes a pattern for inspecting the rotational accuracy of the moving means.

8. A semiconductor manufacturing system with a self-diagnosing function as set forth in claim 7, wherein said pattern for inspecting the rotational accuracy is a cross-shaped pattern.

9. A semiconductor manufacturing system with a self-diagnosing function as set forth in claim 1, wherein said alignment means has a picture image processing section for detecting the pattern position of each of said groups of patterns for inspecting the accuracy of the moving means by pattern matching.

10. A semiconductor manufacturing system having a self-diagnosing function, the system comprising:

a reference wafer for inspecting at least positional accuracy and mechanical accuracy of the system, the reference wafer having a group of patterns for inspecting the positioning accuracy consisting of patterns being regularly spaced apart from one another and a group of patterns for inspecting the mechanical accuracy consisting of patterns being irregularly spaced apart from one another and in parallel to said group of patterns for inspecting positioning accuracy;

a housing section for housing said reference wafer;

a conveying means capable of conveying said reference wafer from said housing section to an alignment position and from said alignment position to said housing section;

a moving means capable of moving said reference wafer at least in one of an X axial direction and a Y axial direction;

alignment means for coinciding an extending direction of each of said group of patterns of said reference wafer that has been conveyed to said alignment position, with a moving direction of said moving means, for detecting a position of at least one pattern of each of the group of patterns for inspecting the positioning accuracy when said moving means is delivered by an interval between the regular patterns, and for detecting a pattern position of each of said group of patterns for inspecting the mechanical accuracy when said moving means is delivered by an interval value between the irregular patterns; and inspecting means for inspecting the positioning accuracy of said moving means based on the detected value of the pattern position of said group of patterns for inspecting the positioning accuracy that has been detected by said alignment means and the interval value between the regular patterns, and for detecting the mechanical accuracy of said moving means based on the detected value of the position of the pattern of the group of patterns for inspecting the mechanical accuracy that has been detected by said alignment means and the interval between the interval patterns.

11. A semiconductor manufacturing system with a self-diagnosing function as set forth in claim 10, wherein said group of patterns for inspecting the mechanical accuracy consists of first irregular patterns and second irregular patterns being spaced apart a random interval from one another on the basis of a table of random numbers, said second irregular patterns displaced from and parallel to but symmetrically opposite to said first irregular patterns.

12. A self-diagnosing method of a semiconductor manufacturing system with a self-diagnosing function, comprising:

a step of taking out of a housing section a reference wafer for inspecting the system accuracy, said reference wafer having groups of patterns each including a plurality of patterns for inspecting at least positional accuracy and mechanical accuracy of a moving device and conveying said reference wafer to an alignment position for inspecting the moving device accuracy;

a step which coincides an extending direction of the groups of patterns of said reference wafer that has been conveyed to said alignment position, with a moving direction of said moving device;

a step of detecting a position of any pattern of said plurality of patterns when said moving device is delivered by an interval between each of the patterns of said groups of patterns, and inspecting the accuracy of said moving device based on the detected position and said interval between each of the patterns; and a step of housing said reference wafer for inspecting the system accuracy into said housing section from said alignment position.

13. A self-diagnosing method of a semiconductor manufacturing system with a self-diagnosing function as set forth in claim 12, wherein said housing section is a housing section specialized for said reference wafer.

14. A self-diagnosing method of a semiconductor manufacturing system with a self-diagnosing function as set forth in claim 12, wherein said housing section is a combined housing section for housing said reference wafer and a wafer to be worked on.

15. A self-diagnosing method of a semiconductor manufacturing system with a self-diagnosing function as set forth in claim 12, wherein the extending direction of each said groups of patterns is directed in one direction.

16. A self-diagnosing method of a semiconductor manufacturing system with a self-diagnosing function as set forth in claim 12, wherein the extending direction of each of said groups of patterns includes a first direction and a second direction perpendicularly intersecting said first direction, and said self-diagnosing method of a semiconductor manufacturing system with a self-diagnosing function comprises a step which coincides said first direction with a moving direction along an X axis of said moving device, and coinciding with said direction perpendicularly intersecting said first direction with the moving direction along a Y axis of said moving device.

17. A self-diagnosing method of a semiconductor manufacturing system with a self-diagnosing function as set forth in claim 12, comprising:

a step of detecting mechanical vibrations of each of said groups of patterns and inspecting the mechanical vibrations at the time of stopping of said reference wafer after said delivery of an interval between each of the patterns is made.

18. A self-diagnosing method of a semiconductor manufacturing system with a self-diagnosing function as set forth in claim 12, comprising:

a step of coinciding a center of said reference wafer that has been conveyed to said alignment position with a rotary center of said moving device for alignment; and a step of rotating said reference wafer through a predetermined angle by said moving device, and inspecting the rotational accuracy of said moving device based on a rotational accuracy-inspecting pattern formed in said reference wafer.

19. A self-diagnosing method of a semiconductor manufacturing system with a self-diagnosing function as set forth in claim 18, wherein said rotational accuracy inspecting pattern is a cross-shaped pattern.

20. A self-diagnosing method of a semiconductor manufacturing system with a self-diagnosing function as set forth in claim 12, wherein an alignment means seeks a position by inspecting the plurality of patterns through pattern matching by use of picture image processing.

21. A self-diagnosing method of a semiconductor manufacturing system with a self-diagnosing function, comprising:

a step of taking out of a housing section a reference wafer for inspecting the system accuracy, said reference wafer having a group of patterns for inspecting the positioning accuracy consisting of patterns regularly spaced apart from one another and a group of patterns for inspecting the mechanical accuracy consisting of patterns arranged in parallel to said group of patterns for inspecting the positioning accuracy and irregularly spaced apart from one another, and conveying said reference wafer to an alignment position;

a step which coincides an extending direction of each of said group of patterns of said reference wafer that has been conveyed to said alignment position, with a moving direction of a moving device for alignment;

a step of detecting a position of any pattern of said group of patterns for inspecting the positioning accuracy when said moving device is delivered by an interval between the regular patterns of said group of patterns for inspecting the positional accuracy, and inspecting the positioning accuracy of said moving device based on the detected position and said interval between the regular patterns;

a step of detecting a position of any pattern of said group of patterns for inspecting the mechanical accuracy when said moving device is delivered by an interval between the irregular patterns of said group of patterns, and inspecting the mechanical accuracy of said moving device based on the detected position and the interval between the irregular patterns; and a step of housing said reference wafer for inspecting the system accuracy into said housing section from said alignment position.

\* \* \* \* \*